United States Patent
Baek

(10) Patent No.: US 8,312,839 B2
(45) Date of Patent: Nov. 20, 2012

(54) MIXING FREQUENCY AT MULTIPLE FEEDING POINTS

(75) Inventor: Jonghoon Baek, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 12/730,886

(22) Filed: Mar. 24, 2010

(65) Prior Publication Data

US 2010/0245214 A1 Sep. 30, 2010

Related U.S. Application Data

(60) Provisional application No. 61/162,836, filed on Mar. 24, 2009.

(51) Int. Cl.
*C23C 16/50* (2006.01)

(52) U.S. Cl. ....... 118/723 MW; 118/723 R; 315/111.21

(58) Field of Classification Search ............. 315/111.21; 156/345.48; 118/723 R, 723 MW
See application file for complete search history.

(56) References Cited

U.S. PATENT DOCUMENTS

| | | | |
|---|---|---|---|
| 5,252,178 A | 10/1993 | Moslehi | |
| 6,232,236 B1 * | 5/2001 | Shan et al. | 438/715 |
| 6,361,644 B1 * | 3/2002 | Collins | 156/345.1 |
| 6,572,732 B2 * | 6/2003 | Collins | 156/345.48 |
| 7,141,516 B2 | 11/2006 | Kawamura et al. | |
| 7,205,034 B2 * | 4/2007 | Kawamura et al. | 427/569 |
| 2001/0009139 A1 * | 7/2001 | Shan et al. | 118/723 E |
| 2010/0015357 A1 * | 1/2010 | Hanawa et al. | 427/570 |
| 2011/0021030 A1 * | 1/2011 | Ji et al. | 438/714 |
| 2011/0031217 A1 * | 2/2011 | Himori | 216/71 |
| 2011/0281435 A1 * | 11/2011 | Sadjadi et al. | 438/703 |
| 2012/0043518 A1 * | 2/2012 | Cheng et al. | 257/4 |

FOREIGN PATENT DOCUMENTS

JP 2001-274099 A 10/2001

OTHER PUBLICATIONS

Satake et al., "Experimental and numerical studies on voltage distribution in capacitively coupled very high frequency plasmas," Plasma Sources Sci. Technol. 13 (2004) 436-445.

Yamakoshi et al., "A technique for uniform generation of very-high-frequency plasma suited to large-area thin-film deposition," Applied Physics Letters 88, 081502 (2006).

* cited by examiner

*Primary Examiner* — Don Le
(74) *Attorney, Agent, or Firm* — Patterson & Sheridan, LLP

(57) ABSTRACT

Embodiments disclosed herein generally relate to obtaining a substantially uniform plasma distribution within a large area processing chamber. For large area processing chambers that utilize RF voltages, standing waves can lead to deposition and/or etching non-uniformities. By applying RF voltage in at least two separate locations at two separate, but close frequencies with or without phase modulation, the wave interference pattern moves across the electrode. By moving the standing wave across the electrode, the plasma generated in the chamber can, over time, be substantially uniform.

18 Claims, 8 Drawing Sheets

MIXING FREQUENCY AT MULTIPLE FEEDING POINTS

CROSS-REFERENCE TO RELATED APPLICATIONS

This application claims benefit of U.S. Provisional Patent Application Ser. No. 61/162,836, filed Mar. 24, 2009, which is herein incorporated by reference.

BACKGROUND OF THE INVENTION

1. Field of the Invention

Embodiments disclosed herein generally relate to a method and apparatus in which RF voltage is applied at multiple points and at different frequencies.

2. Description of the Related Art

As the demand for larger flat panel displays (FPDs) continues to grow, so does the size of the chambers used to fabricate the FPDs. Additionally, with increasing environmental consciousness, people have been looking to renewable resources such as solar. Solar farms have been proposed which will utilize large area solar panels. Substrates used for fabricating solar panels and FPDs may have an area of about 1 square meter or larger.

There are numerous types of chambers that are used in the process of fabricating FPDs and solar panels including deposition chambers such as plasma enhanced chemical vapor deposition (PECVD) chambers and physical vapor deposition (PVD) chambers, as well as etching chambers.

PECVD, PVD, and etching chambers have been used for semiconductor processing for many years. In recent years, the industry standard for semiconductor wafers is 300 mm in diameter. Thus, the substrates used for fabricating FPDs and solar panels are significantly larger than semiconductor wafers.

Scaling up from a 300 mm wafer chamber to a chamber used to process substrates having an area of 1 square meter or larger is not a simple process. The increase in chamber volume can lead to difficulties such as substrate throughput issues and deposition uniformity issues.

Therefore, there is a need for an apparatus that can process large area substrates.

SUMMARY OF THE INVENTION

Embodiments disclosed herein generally relate to obtaining a substantially uniform plasma distribution within a large area processing chamber. For large area processing chambers that utilize RF voltages, standing waves (interference wave patterns) can lead to deposition and/or etching non-uniformities. By applying RF voltage in at least two separate locations at two separate, but close frequencies, the interference wave pattern moves across the electrode. By moving the interference wave pattern across and over the electrode, the plasma generated in the chamber can, over time, be substantially uniform.

In one embodiment, a method includes introducing a gas into a processing chamber. The processing chamber has an electrode disposed opposite a substrate. The method also includes applying a first RF voltage of a first frequency to the electrode at a first location and applying a second RF voltage of a second frequency different than the first frequency to the electrode at a second location spaced from the first location. The method additionally includes igniting the gas into a plasma and processing the substrate with the plasma.

In another embodiment, a plasma enhanced chemical vapor deposition method is disclosed. The method includes introducing a processing gas through a backing plate at a first location and into a plenum and flowing the processing gas from the plenum through a gas distribution showerhead and into a processing area of a processing chamber. The method also includes applying a first RF voltage from a first RF power source at a first frequency to the backing plate at a second location spaced from the first location and applying a second RF voltage from a second RF power source at a second frequency different from the first frequency. The method also includes igniting the processing gas into a plasma and depositing material onto a substrate disposed in the processing chamber opposite the gas distribution showerhead.

In another embodiment, a plasma enhanced chemical vapor deposition apparatus is disclosed. The apparatus includes a backing plate and a gas distribution showerhead electrically coupled to the backing plate. The gas distribution showerhead has a plurality of gas passages extending therethrough. The apparatus also includes a first RF power source coupled to the backing plate at a first location. The first RF power source is capable of producing a first RF voltage at a first frequency. The apparatus also includes a second RF power source coupled to the backing plate at a second location separate from the first location. The second RF power source is capable of producing a second RF voltage at a second frequency different than the first frequency.

In another embodiment, an apparatus includes an electrode and a first RF power source coupled to the electrode at a first location. The first RF power source is capable of producing a first RF voltage at a first frequency. The apparatus also includes a second RF power source coupled to the electrode at a second location separate from the first location. The second RF power source is capable of producing a second RF voltage at a second frequency different than the first frequency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to obtaining a substantially uniform plasma distribution within a large area processing chamber. For large area processing chambers that utilize RF voltages, standing waves (interference wave patterns) can lead to deposition and/or etching non-uniformities. By applying RF voltage in at least two separate locations at two separate, but close frequencies, the interference wave pattern moves across the electrode. By moving the interference wave pattern across and over the electrode, the plasma generated in the chamber can, over time, be substantially uniform.

Embodiments disclosed herein generally relate to an apparatus and method for generating a substantially uniform plasma in an apparatus. The embodiments discussed herein will make reference PECVD apparatus. A suitable PECVD apparatus is manufactured by AKT America, Inc., a subsidiary of Applied Materials, Inc., Santa Clara, Calif. While the embodiments discussed herein reference a PECVD apparatus, it is to be understood that the embodiments may be practiced in other chambers as well, including those sold by other manufacturers.

Figure 1:
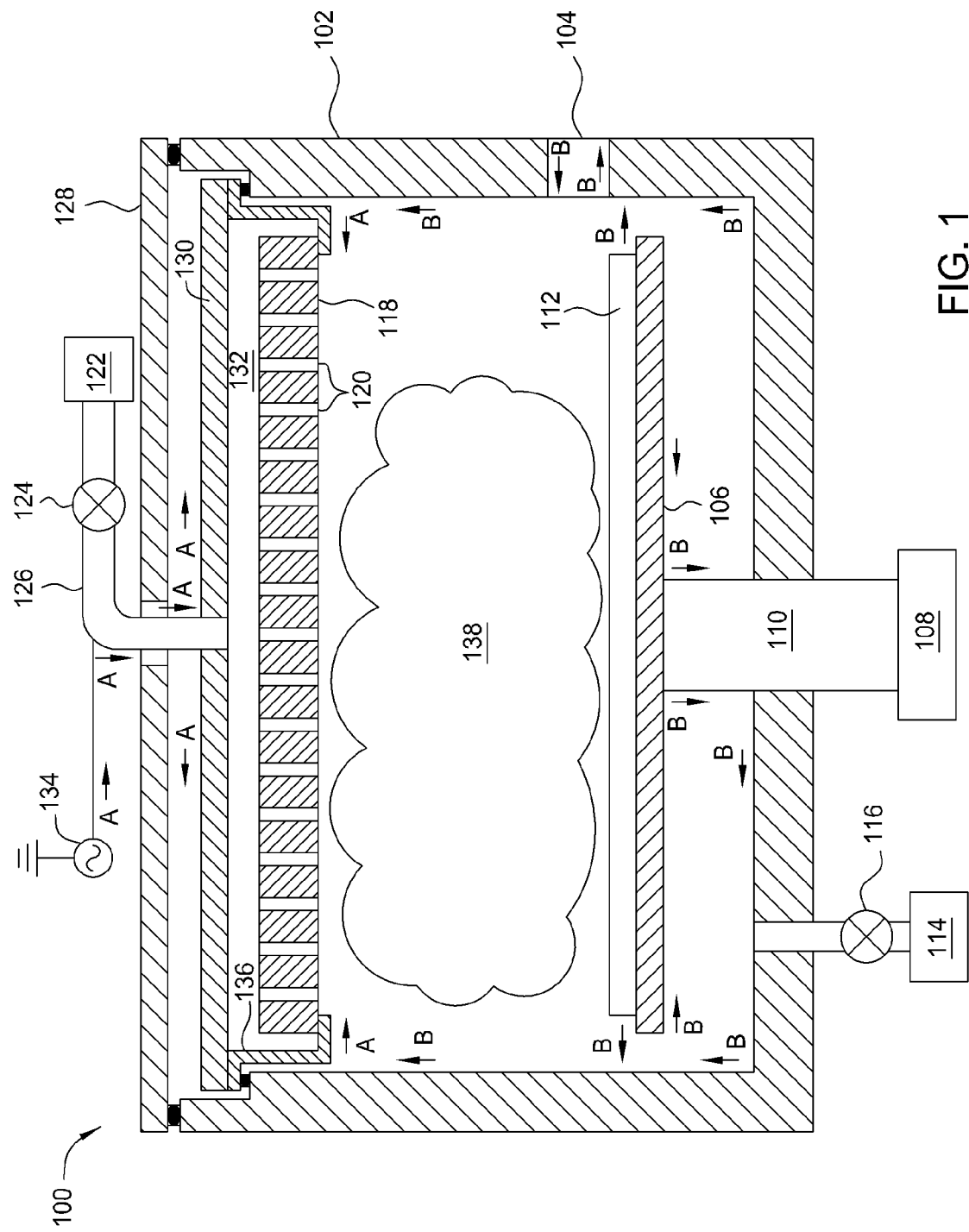
FIG. 1 is a schematic cross sectional view of an apparatus according to one embodiment.

FIG. 1 is a schematic cross sectional view of an apparatus 100 according to one embodiment. The apparatus 100 includes chamber walls 102 with at least one wall 102 having a slit valve opening 104 therethrough to permit substrates to enter and exit the apparatus 100. A substrate 112 may be placed onto a substrate support 106 for processing. The substrate support 106 may comprise a conductive material. In one embodiment, the substrate support 106 may comprise aluminum. In one embodiment, the substrate support 106 may have an anodized coating such as anodized aluminum thereon. The substrate support 106 may sit atop a pedestal 110 that moves up and down by an actuator 108 such that the substrate 112 is moved from a processing position to a transfer position.

The processing chamber may be evacuated by a vacuum pump 114 that is coupled to the bottom of the chamber. It is to be understood that while the vacuum pump 114 is shown coupled to the bottom of the chamber, the vacuum pump 114 may be coupled to the chamber at other locations. A valve 116 may be selectively opened and closed to control the degree of vacuum obtained with the vacuum pump 114.

A gas distribution showerhead 118 may sit across the processing space from the substrate support 106. The showerhead 118 may have a plurality of gas passages 120 therethrough that permit processing gas and/or cleaning gas radicals to enter the processing space. Gas may be introduced into the chamber from a gas source 112. A valve 124 may be selectively opened to control the amount of gas that is allowed to enter the processing chamber. The gas travels through a tube 126 that is coupled with a backing plate 130. The tube 126 passes through the lid 128 of the processing chamber. The lid 128 is at atmospheric pressure as is the space between the lid 128 and the backing plate 130. The gas travels through the tube 126 and the backing plate 130 before expanding into the plenum 132 between the showerhead 118 and the backing plate 130. Within the plenum 132, the gas may expand and substantially evenly distribute before passing through the gas passages 120 into the processing space.

A power source 134 may be coupled with the processing chamber. In one embodiment, the power source 134 may comprise an RF power source. In one embodiment, the RF power source may operate within a range of about 0.1 MHz to about 10 GHz. The power source 134 is coupled to the tube 126. RF voltage has a 'skin effect' and therefore penetrates only to a certain, calculatable depth when traveling along conductive articles. Thus, the processing gas traveling through the tube 126 does not see the RF voltage traveling along the outside of the tube 126 and does not prematurely ignite into a plasma. The RF voltage travels, as shown by arrows "A", along the outside surface of the tube 126, the back surface of the backing plate 130, down along a bracket 136, and along the front surface of the showerhead 118 that is facing the substrate 112 during processing. The RF voltage ignites the processing gas into a plasma 138 and material is deposited onto the substrate 112.

RF voltage seeks to return to the source driving it. The substrate support 106 may be part of the RF return path, which some in industry may refer to as an anode in opposition to the 'hot' cathode or showerhead 118. The RF voltage then travels back to the power source 134 as shown by arrows "B". As shown in FIG. 1, the RF voltage may return along the wall 102 having the slit valve opening 104 therethrough such that the RF voltage travels along the border of the opening 104.

Due to the large area of the showerhead or electrode, the RF voltage may have an interference wave pattern that distorts the plasma. A specific example for wave interference pattern is a standing wave. A standing wave, also known as a stationary wave, is a wave that remains in a constant position. This phenomenon can occur as a result of interference between two waves traveling in opposite directions.

Figures 2A, 2B:
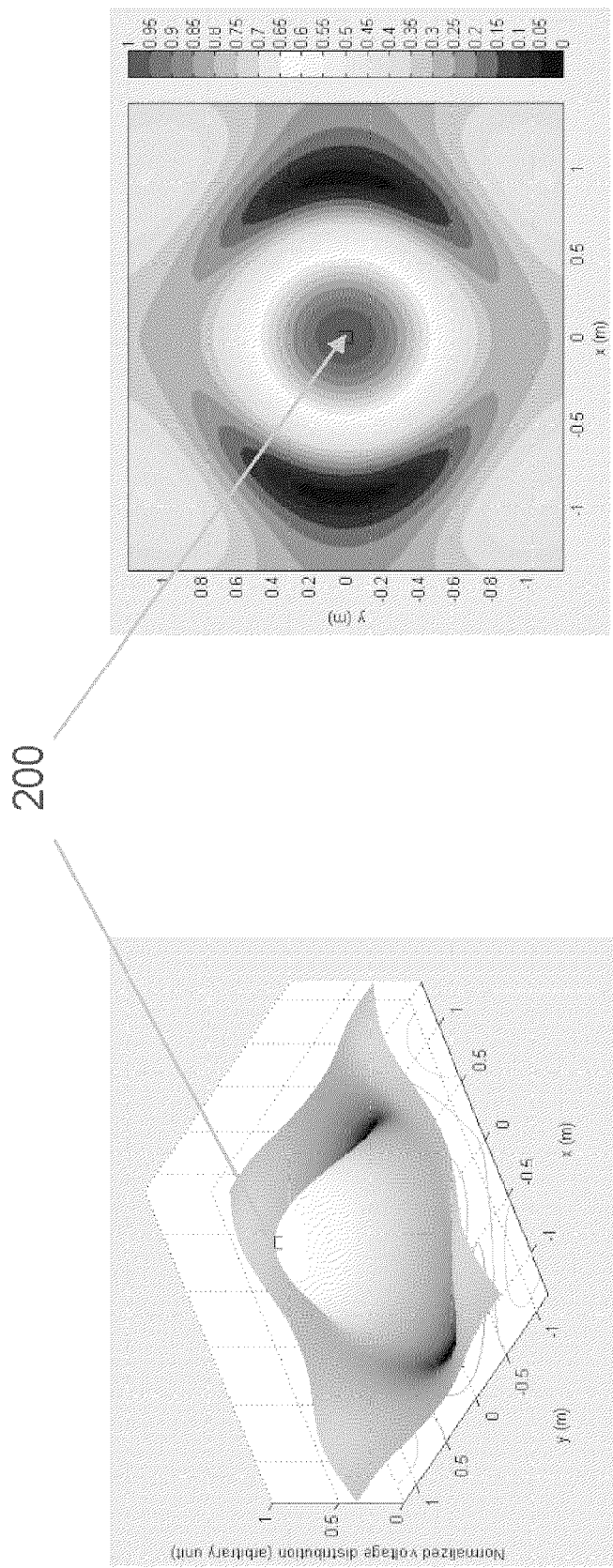
FIG. 2A is a schematic isometric view of a plasma distribution.
FIG. 2B is a graph showing the standing wave distribution across the electrode of FIG. 2A.

FIG. 2A is a schematic isometric view of a plasma distribution in which the standing wave has created a center peak 200 compared to the remainder of the plasma. The center peak is due to the standing wave of the particular applied RF voltage having an apex of the wave near the center of the electrode. For large area processing chambers, the electrode is generally rectangular or polygonal in shape with the four sides having fairly close lengths. When the large area electrode is sufficiently large, the standing wave may occur at the center of the electrode. Thus, when the RF voltage travels from the applied surface to the opposite surface, the apex of the RF voltage may be generally in the center of the electrode because the RF voltage has generally traveled the same distance from the initial coupling point. For a PECVD system, the apex of the wave would occur near the center of the surface of the showerhead that faces the substrate. Thus, the plasma is not uniformly distributed due to the standing wave effect or wave interference pattern.

Plasma density is strongly affected by electric field distribution as shown in FIG. 2B. When the plasma density is not uniformly distributed, the material deposited onto the substrate may not have a uniform thickness across the substrate and/or the material deposited may have different properties. For example, when silicon is deposited, a non-uniform plasma density may lead to microcrystalline silicon being deposited on a first area of a substrate and amorphous silicon being deposited on a second area of the substrate. Alternatively, a non-uniform plasma density distribution may lead to uneven etching of material from a substrate.

To overcome the non-uniformity by the standing wave effect or wave interference pattern, it may be beneficial to move the wave interference pattern across the electrode. If multiple, close RF frequencies are applied at multiple points to the electrode, the apex of the standing wave will move. The frequency difference will determine the speed with which the standing wave moves. Two separate RF feed points, each supplying RF voltage at different, close frequencies, may be enough to reduce non-uniformity of the plasma if the current is confined to one dimension.

Two or more different frequencies at two or more points with relative phase difference also move the wave interference pattern. For example, a first frequency applied at a first position and a second frequency applied at the other points which have relative phase difference with respect to each other lead to the wave interference pattern movement depending on the relative phase difference and positions. The same concept can be applied on any frequency region. In other words, any wave such as acoustic wave, RF wave, microwave and optical wave can lead to the wave interference pattern movement by mixing the different frequencies. Specifically, 60 Mhz frequency was shown as an example below, but any frequency wave interference pattern can be moved with different configurations by mixing different frequencies. The mixing of two or multiple different wavelength laser beams or two or multiple different frequency microwaves are other examples even though the configuration would be different depending on the applications.

The feeding points of the RF voltage should be different. If the feeding point is the same, any benefit of utilizing different frequencies will be lost because the same magnitude of a different frequency should collide with each other. In other words, each wave should propagate in the different direction and met each other to have an interference pattern. If the feeding points are the same, the two different frequency amplitudes will be distributed to the entire electrode in the same ratio. It means the two kinds of same frequencies collide with each other. If we can separate the two frequencies and make them collide below the diffuser, a uniform plasma density, over time, may be produced. The higher the frequency of the RF voltage, the more pronounced the improvement because lower frequencies have less of a standing wave effect.

Figure 3:
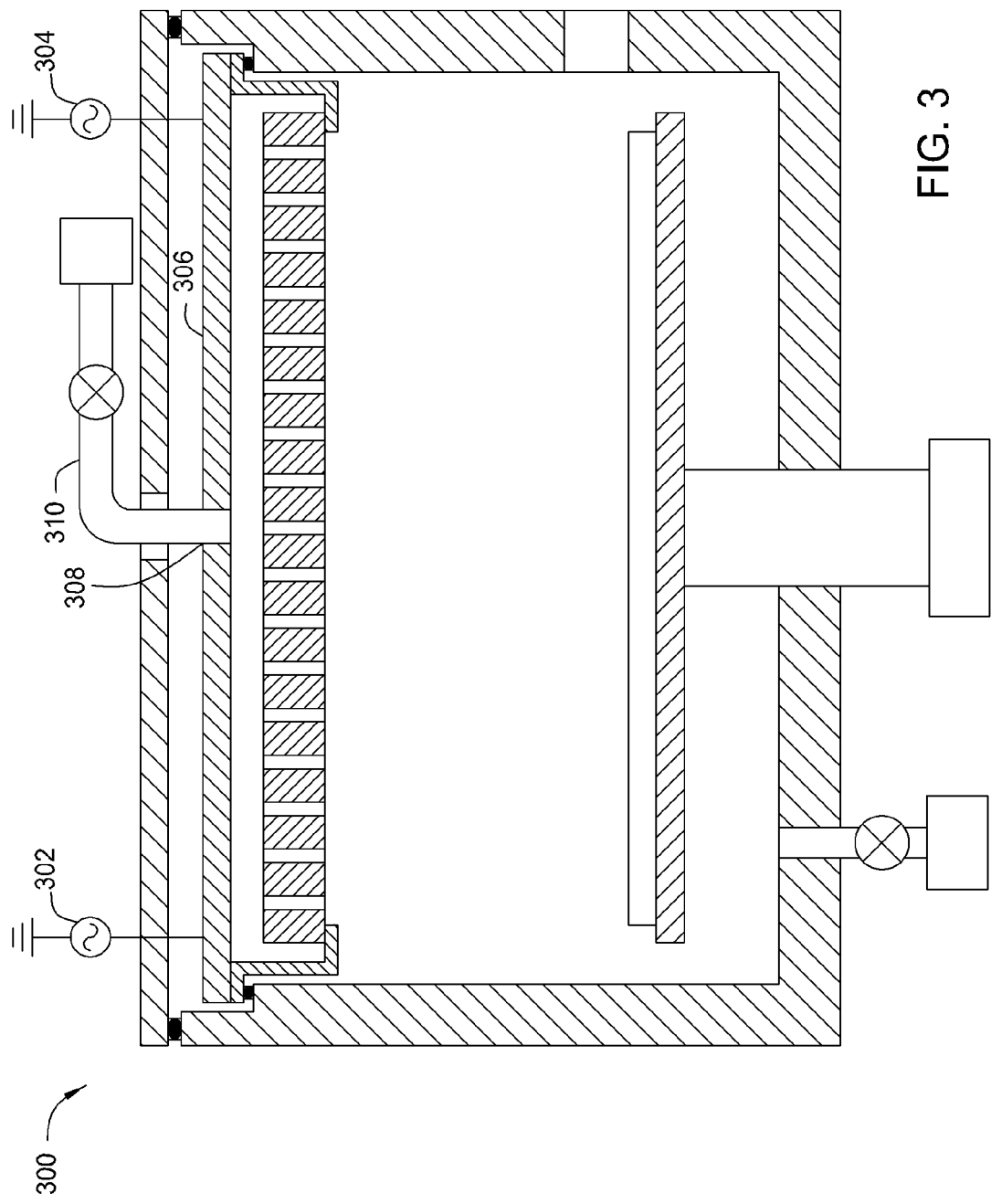
FIG. 3 is a schematic cross sectional view of an apparatus according to another embodiment.

FIG. 3 is a schematic cross sectional view of an apparatus 300 according to another embodiment. In the embodiment shown in FIG. 3, there are two separate RF power sources 302, 304 that are coupled to the backing plate 306 in a PECVD system. The locations where the RF power sources 302, 304 are coupled to the backing plate 306 are not to be limited to the locations shown in FIG. 3, rather, the locations shown in FIG. 3 are merely one embodiment. In FIG. 3, the power sources 302, 304 are coupled to the backing plate 306 at locations spaced from each other and spaced from the center 308 of the backing plate 306 where the gas tube 310 couples to the backing plate 306. It is to be understood that one of the power sources 302, 304 may be coupled to the backing plate 306 at the center 308 if desired. Additionally, while two power sources 302, 304 have been shown, it is understood that more power sources 302, 304 may be present and each coupled to a separate location.

Figures 4A, 4B:
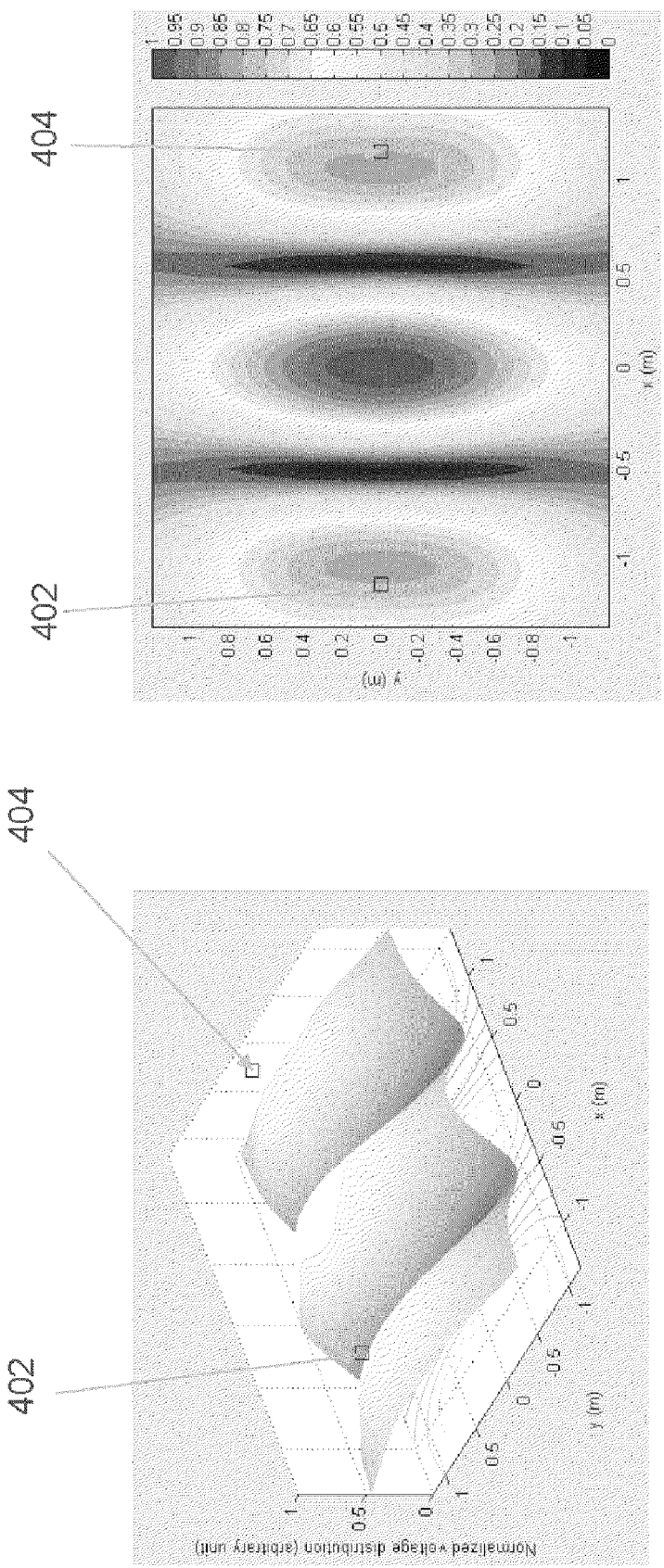
FIG. 4A is a graph showing the wave interference pattern across an electrode where RF voltage is applied at two ends with no phase difference.
FIG. 4B is a graph showing the standing wave distribution across the electrode of FIG. 4A.

The phase of the RF power source may have an effect on the wave interference pattern. FIG. 4A is a graph showing the wave distribution across an electrode where RF voltage is applied at two ends 402, 404 with no phase difference. In other words, the same RF voltage at the same phase is applied at two points that each correspond to an edge of the electrode.

FIG. 4B is a graph showing the standing wave distribution across the electrode of FIG. 4A. In FIG. 4A, the RF voltage was applied at 60 MHz at both locations.

As shown in FIG. 4A, the electrode has a surface area of greater than about 4 square meters. The electrode has a length in the "X" direction of greater than about 2 meters and a width in the "Y" direction of about 2 meters. The RF power sources were coupled to the electrode at opposite ends of the electrode in the "X" direction and in the substantial center of the electrode in the "Y" direction. It is to be understood that the RF power sources may be coupled to the electrode at opposite ends of the electrode in the "Y" direction and substantially in the center of the electrode in the "X" direction as well.

The wave interference pattern created by the RF voltage is not evenly distributed across the electrode in FIG. 4A. While not wishing to be bound by theory unless specifically claimed, it is believed that the RF voltages, because the RF power sources have been coupled to the edge of the electrode in the "X" direction, have the apex of the standing wave at the edge of the electrode in the "X" direction. Because the same frequency is used at both locations, the standing wave does not move across the electrode and thus, over time, averages out to center high deposition and/or etching.

Figures 4C, 4D:
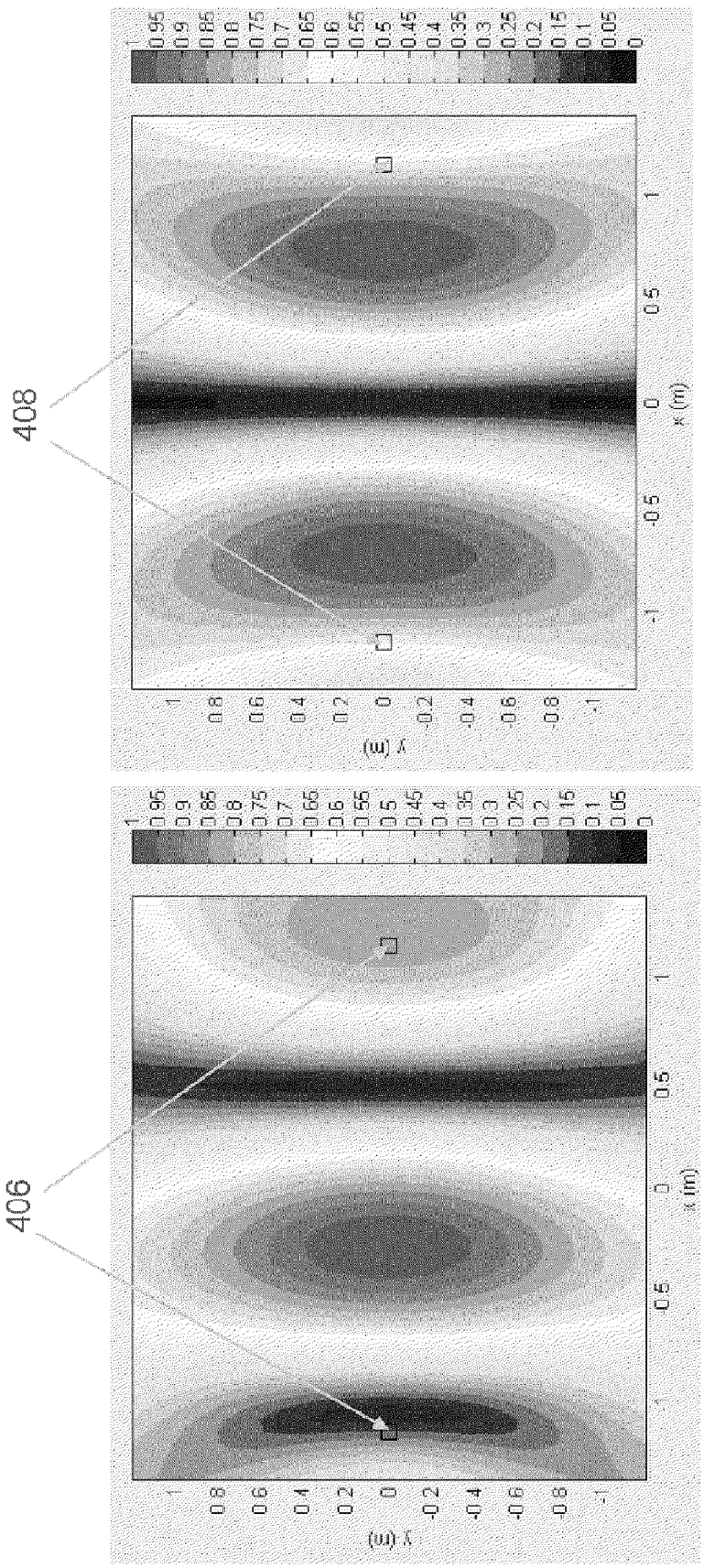
FIG. 4C is a graph showing the standing wave distribution across an electrode where RF voltage is applied at two ends with a 90 degree phase difference.
FIG. 4D is a graph showing the standing wave distribution across an electrode where RF voltage is applied at two ends with a 180 degree phase difference.

FIG. 4C is a graph showing the standing wave distribution across an electrode where RF voltage is applied at two ends 406 with a 90 degree phase difference. FIG. 4D is a graph showing the standing wave distribution across an electrode where RF voltage is applied at two ends 408 with a 180 degree phase difference. In each of FIGS. 4C and 4D, 60 MHz RF voltage was applied to the electrode at the edge in the "X" direction and the substantial center in the "Y" direction. As seen from FIGS. 4C and 4D, when the phase is shifted, the apex of the standing wave shifts as well. Thus, the phase of the RF voltage, while holding the frequency and the location of the same, may affect the standing wave profile. The standing wave remains stationary and thus leads to non uniform deposition and/or etching.

While not wishing to be bound by theory unless explicitly recited in the claims, it is believe that by choosing the phasing between multiple ports, the correct combination of phasing and signal strength at each port, the thickness pattern may be controlled. Obtaining the optimal combination of phase modulation may be one solution. The other variable that may be altered is the frequency. The combination of multiple different frequencies or the combination of different frequencies and phase modulation may be another solution.

Mixed frequencies that are close to each other (i.e., about several hundred kHz to about 2 Mhz; the frequency difference depends on the frequency applied) may produce a desired standing wave that averages over time to be flat across the electrode. In one embodiment, the applied frequencies may be less than about less than 1 MHz different. The different frequency shifts the apex with time and could decrease a thickness uniformity issue.

Figure 5:
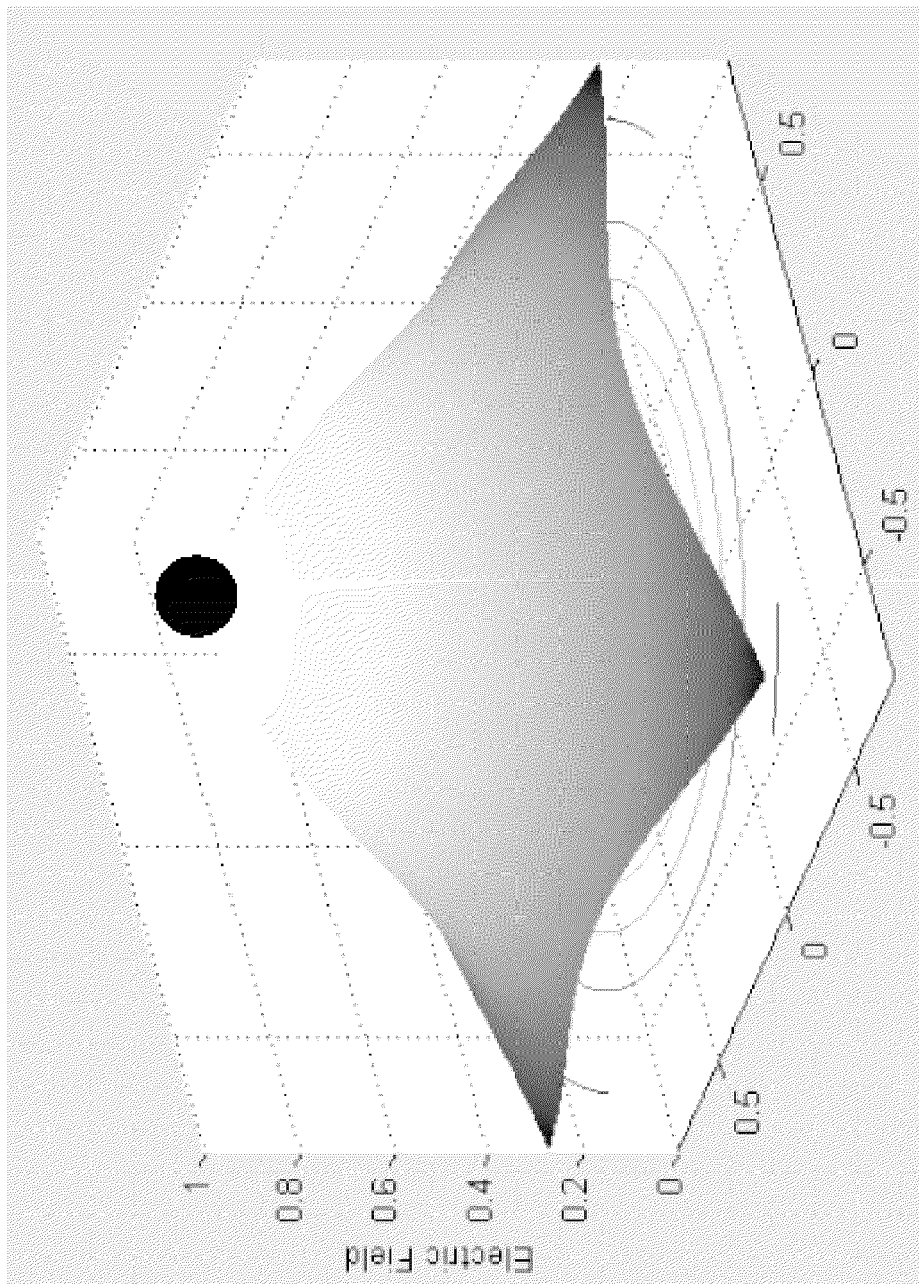
FIG. 5 is a graph showing the time average voltage distribution for an RF voltage applied at one location and one frequency.

FIG. 5 is a graph showing the time average voltage distribution for an RF voltage applied at one location and one frequency according to conventional chamber.

Figure 6:
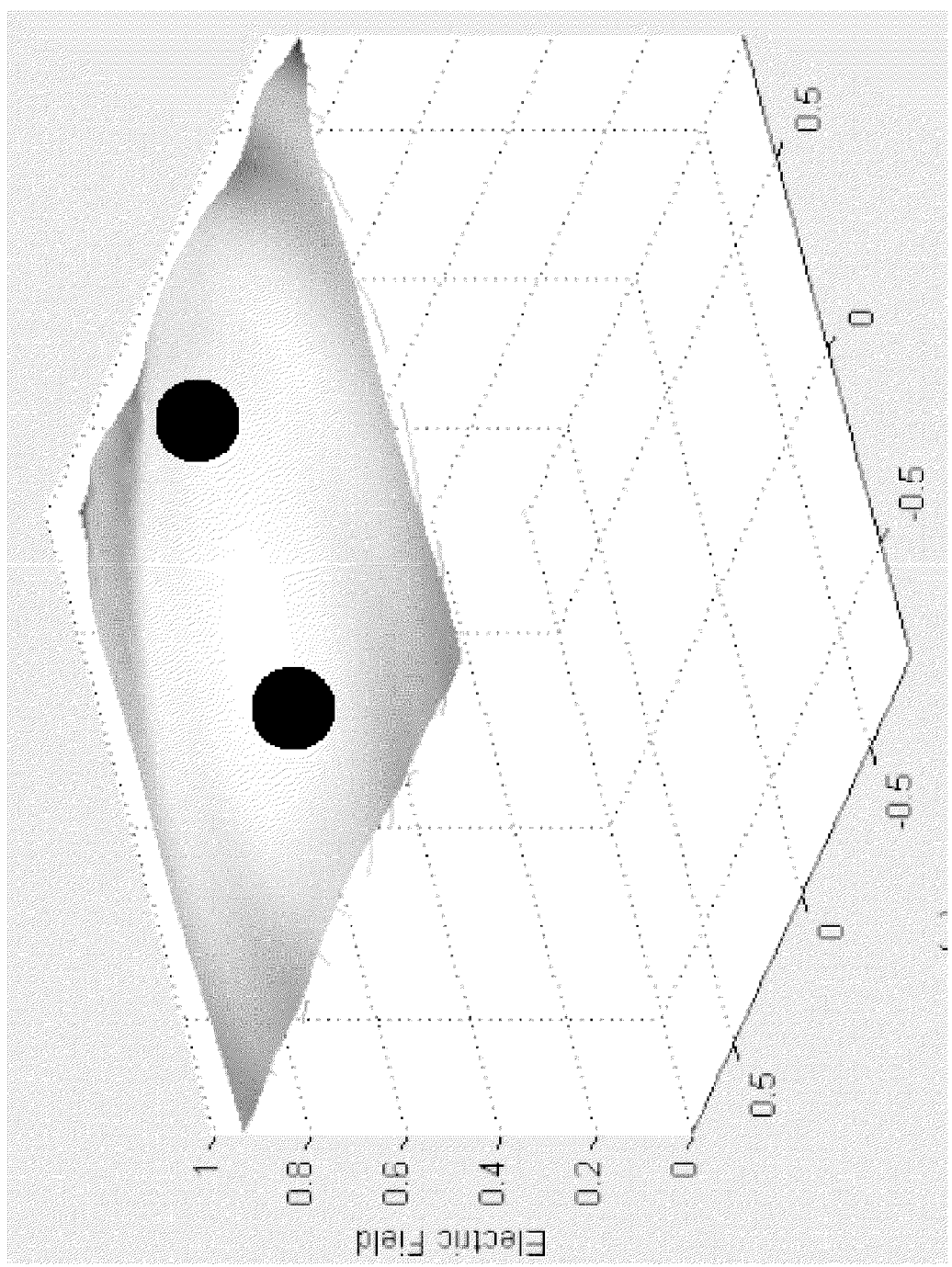
FIG. 6 is a graph showing the time average voltage distribution for an RF voltage applied at two locations and two frequencies according to another embodiment.

FIG. 6 is a graph showing the time average voltage distribution for an RF voltage applied at two locations and two frequencies according to another embodiment. In the embodiment shown in FIG. 6, RF voltage is delivered from two separate sources to two separate locations on an electrode. The electrode is similar in size to those discussed above in relation to FIGS. 4A-4D. In the embodiment shown in FIG. 6, one of the RF power sources delivers RF voltage at a frequency of 60.000 MHz while the other delivers RF voltage at a frequency of 59.999 MHz. At the delivered frequencies, it is seen that the standing wave moves with time such that a substantially flat profile of the standing wave is present. Thus, the multiple frequencies collide and move the standing wave over time.

Mixing frequencies that are close to each other, such as 59.999 MHz and 60.000 MHz as discussed above, makes the electric field uniformity a function of the location where the RF voltage is applied. Thus, the feeding location for the RF voltage can be optimized to meet the needs of the particular electrode. In other words, by selecting two frequencies that are close, the coupling locations for the RF voltage can be optimized to suit the needs of the user.

Figure 7A:
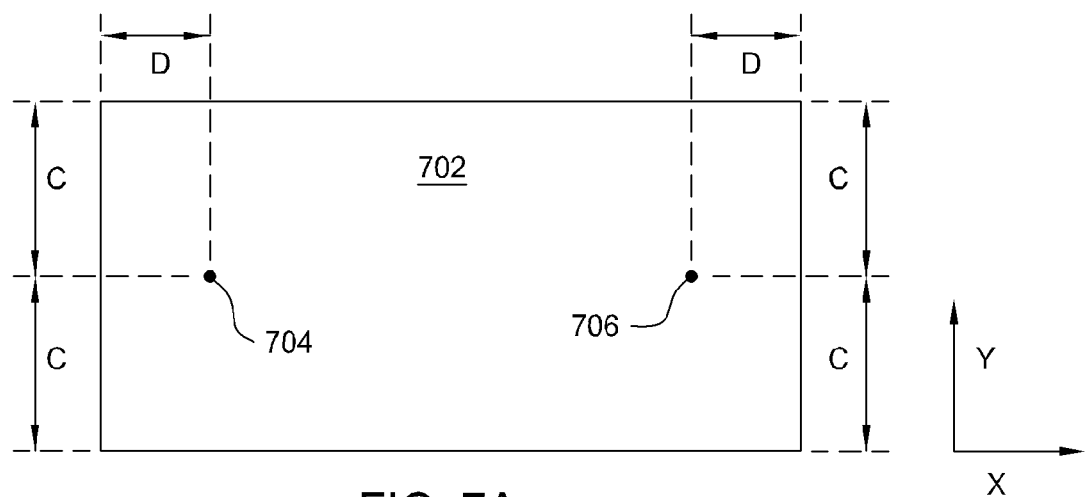
FIGS. 7A-7C are schematic top views showing locations for RF power sources to couple to electrodes according to various embodiments.
Figure 7B:
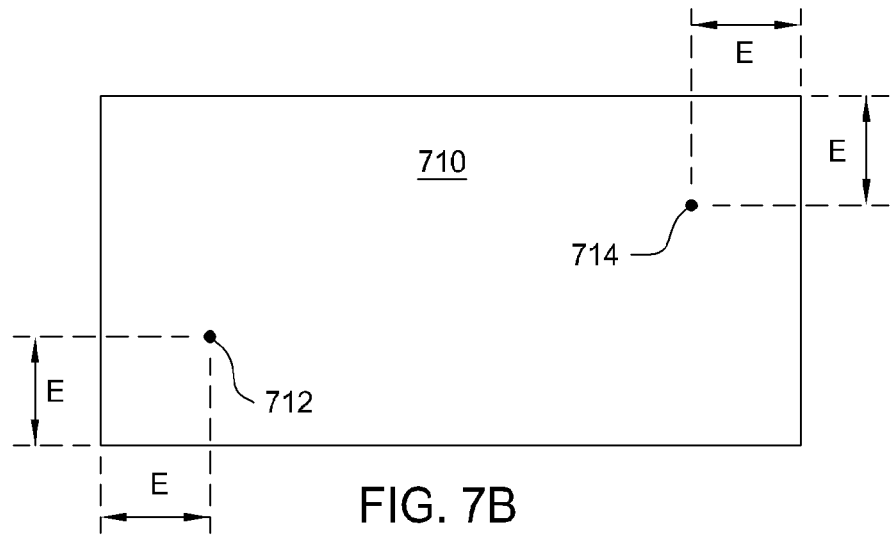
Figure 7C:
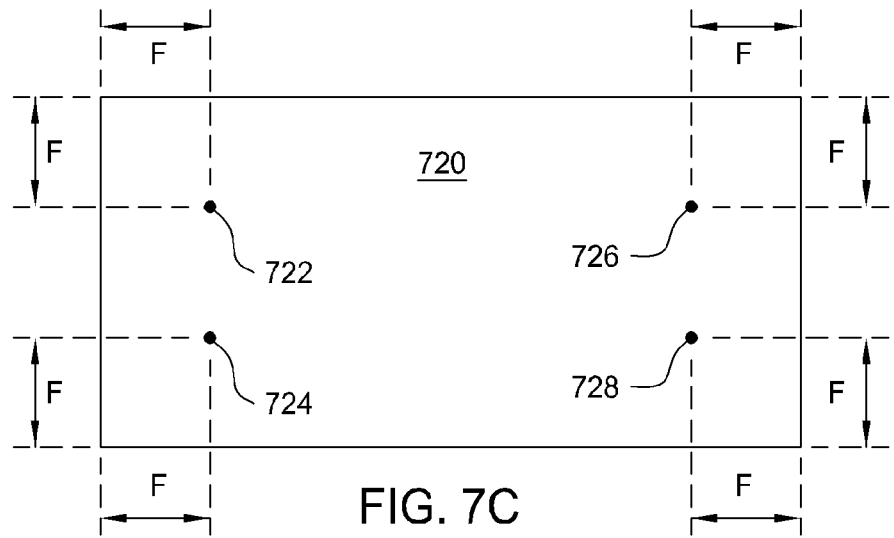

FIGS. 7A-7C are schematic top views showing locations for RF power sources to couple to electrodes according to various embodiments. As shown in FIG. 7A, the RF power sources may be coupled to the electrode 702 at locations 704, 706 that are substantially centered along the "Y" axis as shown by arrows "C" and spaced a substantial equal distance from the edge of the electrode 702 along the "X" axis as shown by arrows "ID". The RF voltage applied at each of the locations 704, 706 would be the same in phase, but different in frequency.

FIG. 7B shows an embodiment where the RF voltage is coupled to the electrode 710 at locations 712, 714 that are not substantially centered along with the "X" axis or the "Y" axis. Rather, the locations 712, 714 are near the corners of the electrode 710. In the embodiment shown in FIG. 7B, the locations 712, 714 are substantially equally spaced from the edge along both the "X" axis and the "Y" axis as shown by arrows "E". The RF voltage applied at each of the locations 712, 714 would be the same in phase, but different in frequency.

FIG. 7C shows an embodiment where RF voltage is coupled to the electrode 720 at four locations 722, 724, 726, 728 that are not substantially centered along with the "X" axis or the "Y" axis. Rather, the locations 722, 724, 726, 728 are near the corners of the electrode 720. In the embodiment shown in FIG. 7C, the locations 722, 724, 726, 728 are substantially equally spaced from the edge along both the "X" axis and the "Y" axis as shown by arrows "F". The RF voltage applied at each of the locations 722, 724, 726, 728 would be the same in phase, but different in frequency. Another implementation is that the RF voltage applied at each of the three locations 722, 724, 726, would be the different phase, but same in frequency while 728 would be different in frequency from the other frequencies. It would be similar effect depending on the phase difference. Similarly, frequency modulation with phase modulation moves the wave interference pattern. When applying more than two RF voltages with frequencies modulation and phase modulation, the RF voltage could be used to stir the plasma that is generated.

By delivering RF voltage to an electrode at more than two separate locations at more than two different, but close frequencies with or without phase modulation, the wave interference pattern may average of time to create a substantially uniform plasma within the large area processing chamber and permit substantially uniform processing to occur.

While the foregoing is directed to embodiments of the present invention, other and further embodiments of the invention may be devised without departing from the basic scope thereof, and the scope thereof is determined by the claims that follow.

The invention claimed is:

1. A method, comprising:
    introducing a gas into a processing chamber, the processing chamber having an electrode disposed near a substrate;
    applying a first RF voltage of a first frequency to the electrode at a first location;
    applying a second RF voltage of a second frequency different than the first frequency to the electrode at a second location spaced from the first location, the second frequency and the first frequency differ by less than about 1 MHz and are applied substantially simultaneously;
    igniting the gas into a plasma; and
    processing the substrate with the plasma.

2. The method of claim 1, wherein the electrode is a backing plate electrically coupled to a gas distribution showerhead.

3. The method of claim 1, wherein the first location and the second location are each spaced a substantially equal distance from the center of the electrode.

4. The method of claim 1, wherein the electrode has a substantially rectangular shape and the first and second locations are each substantially centered between two substantially parallel sides of the electrode.

5. The method of claim 1, wherein the first RF voltage and the second RF voltage are applied in substantially the same phase.

6. The method of claim 1, wherein the method is a plasma enhanced chemical vapor deposition method.

7. The method of claim 1, wherein the gas is silane.

8. The method of claim 7, wherein the processing comprises depositing a material selected from the group consisting of amorphous silicon, microcrystalline silicon, silicon nitride, and combinations thereof.

9. A plasma enhanced chemical vapor deposition method, comprising:
    introducing a processing gas through a backing plate at a first location and into a plenum;
    flowing the processing gas from the plenum through a gas distribution showerhead and into a processing area of a processing chamber;
    applying a first RF voltage from a first RF power source at a first frequency to the backing plate at a second location spaced from the first location;
    applying a second RF voltage from a second RF power source at a second frequency different by less than about 1 MHz from the first frequency, the second RF voltage applied at a third location spaced from the first location and the second location, the second RF voltage applied substantially simultaneously with the first RF voltage;
    igniting the processing gas into a plasma; and
    depositing material onto a substrate disposed in the processing chamber near the gas distribution showerhead.

10. The method of claim 9, wherein the second location and the third location are each spaced a substantially equal distance from the center of the backing plate.

11. The method of claim 9, wherein the backing plate has a substantially rectangular shape and the third location and the second location are each substantially centered between two substantially parallel sides of the backing plate.

12. The method of claim 9, wherein the first RF voltage and the second RF voltage are in phase with each other.

13. The method of claim 9, wherein the processing gas comprises silicon.

14. The method of claim 13, wherein the depositing comprises depositing a material selected from the group consisting of amorphous silicon, microcrystalline silicon, silicon nitride, and combinations thereof.

15. A plasma enhanced chemical vapor deposition apparatus, comprising:
    a backing plate;

a gas distribution showerhead electrically coupled to the backing plate, the gas distribution showerhead having a plurality of gas passages extending therethrough;

a first RF power source coupled to the backing plate at a first location, the first RF power source capable of producing a first RF voltage at a first frequency; and a second RF power source coupled to the backing plate at a second location separate from the first location, the second RF power source capable of producing a second RF voltage at a second frequency that differs from than the first frequency.

16. The apparatus of claim 15, wherein the first location and the second location are each spaced from the center of the backing plate.

17. The apparatus of claim 15, wherein the backing plate has a substantially rectangular shape and the first location and the second location are each substantially centered between two substantially parallel sides of the backing plate.

18. The apparatus of claim 15, further comprising a gas source coupled to the backing plate at a third location spaced from both the first location and the second location.

* * * * *